United States Patent
Rulkens et al.

(10) Patent No.: US 7,294,583 B1
(45) Date of Patent: Nov. 13, 2007

(54) METHODS FOR THE USE OF ALKOXYSILANOL PRECURSORS FOR VAPOR DEPOSITION OF SIO₂ FILMS

(75) Inventors: Ron Rulkens, Milpitas, CA (US); George D. Papasouliotis, Sunnyvale, CA (US); Dennis M. Hausmann, Los Gatos, CA (US); Raihan M. Tarafdar, San Jose, CA (US); Bunsen Nie, Fremont, CA (US); Adrianne K. Tipton, Pleasanton, CA (US); Jeff Tobin, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/021,558

(22) Filed: Dec. 23, 2004

(51) Int. Cl.
*H01L 21/31* (2006.01)
*H01L 21/469* (2006.01)

(52) U.S. Cl. .............. 438/778; 257/E21.279; 257/21.278; 438/788

(58) Field of Classification Search ........ 438/778, 438/788, 789; 257/E21.129, E21.128
See application file for complete search history.

(56) References Cited

U.S. PATENT DOCUMENTS

| | | | |
|---|---|---|---|
| 5,314,724 A | 5/1994 | Tsukune et al. ......... 427/489 |
| 5,525,550 A | 6/1996 | Kato ..................... 438/787 |
| 5,527,561 A | 6/1996 | Dobson ................ 427/383.3 |
| 5,597,395 A | 1/1997 | Bocko et al. ............ 65/33.4 |
| 5,705,028 A | 1/1998 | Matsumoto ............. 156/636 |
| 5,985,770 A | 11/1999 | Sandhu et al. ......... 438/787 |
| 6,030,881 A | 2/2000 | Papasouliotis et al. ... 438/424 |
| 6,064,104 A | 5/2000 | Omid-Zohoor et al. ... 257/510 |
| 6,102,993 A | 8/2000 | Bhandari et al. ........ 106/1.16 |
| 6,133,160 A | 10/2000 | Komiyama et al. ...... 438/761 |
| 6,184,108 B1 | 2/2001 | Omid-Zohoor et al. ... 438/431 |
| 6,184,143 B1 | 2/2001 | Ohashi et al. .......... 438/697 |
| 6,300,219 B1 | 10/2001 | Doan et al. ............ 438/424 |
| 6,316,063 B1 | 11/2001 | Andideh et al. ......... 427/577 |

(Continued)

FOREIGN PATENT DOCUMENTS

JP 5-308071 A 11/1993

(Continued)

OTHER PUBLICATIONS

U.S. Office Action mailed Dec. 30, 2005, from U.S. Appl. No. 11/026,284.

(Continued)

*Primary Examiner*—Caridad Everhart
(74) *Attorney, Agent, or Firm*—Beyer Weaver LLP (57) ABSTRACT

A method for depositing conformal dielectric films uses alkoxy silanol or silanediol precursors and oxidizing and/or hydrolyzing agents. The method produces a material with liquid-like flow properties capable of achieving improved high aspect ratio gap fill more efficiently than previous methods using alkoxysilanes since fewer oxidation reactions are required. In addition, the dielectric can be formed with or without a metal-containing catalyst/nucleation layer, so that metal content in the dielectric film can be avoided, if desired. Seams and voids are therefore avoided in gaps filled more efficiently with higher quality dielectric. In addition, the films as dense as deposited, reducing or eliminating the need for post-deposition processing (e.g., annealing).

23 Claims, 4 Drawing Sheets

U.S. PATENT DOCUMENTS

| | | | |
|---|---|---|---|
| 6,335,261 B1 | 1/2002 | Natzle et al. | 438/435 |
| 6,352,943 B2 | 3/2002 | Maeda et al. | 438/778 |
| 6,352,953 B1 | 3/2002 | Seki et al. | 438/787 |
| 6,372,669 B2 | 4/2002 | Sandhu et al. | 438/787 |
| 6,503,330 B1 | 1/2003 | Sneh et al. | 118/715 |
| 6,504,233 B1 | 1/2003 | Gorczyca et al. | 257/629 |
| 6,511,539 B1 | 1/2003 | Raaijmakers | 117/102 |
| 6,531,377 B2 | 3/2003 | Knorr et al. | 438/435 |
| 6,534,395 B2 | 3/2003 | Werkhoven et al. | 257/194 |
| 6,534,802 B1 | 3/2003 | Schuegraf | 257/194 |
| 6,540,838 B2 | 4/2003 | Sneh et al. | 117/102 |
| 6,551,339 B2 | 4/2003 | Gavronsky | 606/189 |
| 6,551,399 B1 | 4/2003 | Sneh et al. | 117/102 |
| 6,586,349 B1 | 7/2003 | Jeon et al. | 438/785 |
| 6,624,091 B2 | 9/2003 | Yuan | 438/778 |
| 6,780,789 B1 | 8/2004 | Yu et al. | 438/764 |
| 6,784,101 B1 | 8/2004 | Yu et al. | 438/666 |
| 6,802,944 B2 | 10/2004 | Ahmad et al. | 204/192.23 |
| 6,861,334 B2 | 3/2005 | Raaijmakers et al. | 438/435 |
| 6,867,152 B1 | 3/2005 | Hausmann et al. | 438/778 |
| 6,903,005 B1 | 6/2005 | Marsh | 438/627 |
| 6,908,862 B2 | 6/2005 | Li et al. | 438/700 |
| 6,949,481 B1 | 9/2005 | Halliyal et al. | 438/795 |
| 6,984,591 B1 | 1/2006 | Buchanan et al. | 438/778 |
| 7,097,878 B1 | 8/2006 | Rulkens et al. | 427/255.1 |
| 7,129,189 B1 | 10/2006 | Hausmann et al. | 438/778 |
| 7,148,155 B1 | 12/2006 | Tarafdar et al. | 438/778 |
| 7,163,899 B1 | 1/2007 | Cho et al. | 438/758 |
| 7,202,185 B1 | 4/2007 | Hausmann et al. | 438/778 |
| 7,223,707 B1 | 5/2007 | Papasouliotis et al. | 438/800 |
| 2001/0049205 A1 | 12/2001 | Sandhu et al. | 438/787 |
| 2003/0015764 A1 | 1/2003 | Raaijmakers et al. | 257/424 |
| 2003/0092241 A1 | 5/2003 | Doan et al. | 438/424 |
| 2003/0129828 A1 | 7/2003 | Cohen et al. | 438/629 |
| 2003/0134741 A1 | 7/2003 | Weisbeck et al. | 502/243 |
| 2003/0157781 A1 | 8/2003 | Macneil et al. | 438/424 |
| 2004/0004247 A1 | 1/2004 | Forbes et al. | 257/324 |
| 2004/0025787 A1 | 2/2004 | Selbrede et al. | 427/248.1 |
| 2004/0043149 A1 | 3/2004 | Gordon et al. | 427/255.31 |
| 2004/0043569 A1 | 3/2004 | Ahn et al. | 438/287 |
| 2004/0044127 A1 | 3/2004 | Okubo et al. | 525/54.3 |
| 2004/0079728 A1 | 4/2004 | Mungekar et al. | 216/67 |
| 2004/0102031 A1 | 5/2004 | Kloster et al. | 438/619 |
| 2004/0203254 A1 | 10/2004 | Conley et al. | 438/778 |
| 2004/0206267 A1 | 10/2004 | Sambasivan et al. | 438/778 |
| 2004/0222490 A1 | 11/2004 | Raaijmakers et al. | 257/510 |
| 2004/0247787 A1 | 12/2004 | Mackie et al. | 118/715 |
| 2005/0054213 A1* | 3/2005 | Derderian et al. | 438/778 |
| 2005/0112282 A1* | 5/2005 | Gordon et al. | 427/255.18 |
| 2005/0239264 A1 | 10/2005 | Jin et al. | 438/424 |
| 2005/0271813 A1 | 12/2005 | Kher et al. | 427/248.1 |
| 2006/0038293 A1 | 2/2006 | Rueger et al. | 257/751 |
| 2006/0087000 A1 | 4/2006 | Okuno | 257/506 |
| 2006/0127578 A1* | 6/2006 | Lei et al. | 427/255.31 |

FOREIGN PATENT DOCUMENTS

| | | |
|---|---|---|
| JP | 2004-256479 | 9/2004 |
| WO | WO02/27063 | 4/2002 |
| WO | WO03/083167 A1 | 9/2003 |

OTHER PUBLICATIONS

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

U.S. Office Action mailed Dec. 7, 2005, from U.S. Appl. No. 10/874,808.

Ritala et al., "Atomic Layer Deposition", Handbook of Thin Films Materials, vol. 1, 2002, pp. 103-159.

Dennis Michael Hausmann, "Atomic Layer Deposition of Metal Oxide Thin Films," A thesis presented by, Harvard University, 186 pages, Jul. 2002.

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretical Modeling of $SiO_2$ Photochemical Vapor Deposition and Comparison to Experimental Results for Three Oxidant Chemistries: $SiH_4+O_2$, $H_2O/O_2$, and $H_2O_2$", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmospheric Pressure Reactions", Journal of The Electrochemical Society, 146 (1) 276-280 (1999).

Romet et al., "Modeling of Silicon Dioxide Chemical Vapor Deposition from Tetraethyoxysilane and Ozone", Journal of The Electrochemical Society, 148 (2) G82-G90 (2001).

Ikeda et al., "The Effects of Alkoxy Functional Groups on Atmospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

U.S. Office Action mailed May 31, 2005, from U.S. Appl. No. 10/746,274.

Hausmann et al., "Plasma Treatments to Improve the Properties of Silica Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc. filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Deposition", Novellus Systems, Inc., filed Jun. 22, 2004, U.S. Appl. No. 10/874,696, pp. 1-30.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

Cho et al., "Hydroxyl Bond Removal and Film Densification Method for Oxide Films Using Microwave Post Treatment", Novellus Systems, Inc., U.S. Appl. No. Not yet assigned, filed Nov. 15, 2005, pp. 1-27.

U.S. Office Action mailed Feb. 24, 2006, from U.S. Appl. No. 11/077,108.

U.S. Office Action mailed Mar. 24, 2006, from U.S. Appl. No. 10/975,028.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed May 8, 2006, from U.S. Appl. No. 11/327,668.

U.S. Office Action mailed Sep. 29, 2006, from U.S. Appl. No. 11/027,480.

U.S. Office Action mailed Sep. 27, 2006, from U.S. Appl. No. 11/026,284.

U.S. Office Action mailed Jul. 7, 2006, from U.S. Appl. No. 10/875,158.

U.S. Office Action mailed Jan. 16, 2007, from U.S. Appl. No. 10/874,696.

U.S. Office Action mailed Mar. 21, 2007, from U.S. Appl. No. 11/414,459.

U.S. Office Action mailed Apr. 13, 2007, from U.S. Appl. No. 11/026,284.

Papasouliotis et al., "Pulsed Deposition Layer Gap Fill With Expansion Material," Novellus Systems, Inc., U.S. Appl. No. 11/414,459, filed Apr. 28, 2006, pp. 1-28.

Papasouliotis et al., "Conformal Nanolaminate Dielectric Deposition and Etch Back Gap Fill Process and Apparatus," Novellus Systems, Inc., U.S. Appl. No. 11/524,502, filed Sep. 19, 2006, pp. 1-38.

* cited by examiner

METHODS FOR THE USE OF ALKOXYSILANOL PRECURSORS FOR VAPOR DEPOSITION OF SIO₂ FILMS

BACKGROUND OF THE INVENTION

It is often necessary in semiconductor processing to fill a high aspect ratio gap with insulating material. As device dimensions shrink and thermal budgets are reduced, void-free filling of high aspect ratio spaces (AR>3.0:1) becomes increasingly difficult due to limitations of existing deposition processes. The deposition of doped or undoped silicon dioxide assisted by high density plasma CVD, a directional (bottom-up) CVD process, is the method currently used for high aspect ratio (AR) gap-fill. Evolving semiconductor device designs and dramatically reduced feature sizes have resulted in several applications where High Density Plasma (HDP) processes are challenged in filling the high aspect ratio structures (AR>7:1) using existing technology (see, for example, U.S. Pat. No. 6,030,881, which is hereby incorporated by reference herein for all purposes). For structures representative of 65 nm and 45 nm technology nodes, engineering the gap-fill process becomes structure dependent, hence the process needs to be re-optimized, a task of considerable complexity, every time a new structure needs to be filled.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

An alternative to CVD is atomic layer deposition (ALD). ALD methods involve self-limiting adsorption of reactant gases and can provide thin, conformal dielectric films within high aspect ratio features. Atomic Layer Deposition (ALD) is a method with which extremely conformal films can be deposited. ALD methods have been developed for the deposition of $SiO_2$ film. Because the ALD approach deposits only one atomic layer per cycle, it is extremely slow. Recently a method has emerged for self-limiting conformal film growth of multiple $SiO_2$ layers per deposition cycle. See, Hausmann, D.; Becker, J.; Wang, S.; Gordon, R. G. Science 2002, 298, 402 and Miller, K. A.; John, C.; Zhang, K. Z.; Nicholson, K. T.; McFeely, F. R.; Banaszak Holl, M. M. Thin Solid Films 2001, 397, 78.

An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. One drawback, however, to ALD is that the deposition rates are very low. Films produced by ALD are also very thin (i.e., about one monolayer); therefore, numerous ALD cycles must be repeated to adequately fill a gap feature. These processes are unacceptably slow in many manufacturing environment applications.

A related technique, referred to as rapid vapor deposition (RVD) processing, is another alternative. RVD is similar to ALD in that reactant gases are introduced alternately over the substrate surface, but in RVD the silicon oxide film can grow more thickly. Thus, RVD methods allow for rapid film growth similar to using CVD methods but with the film conformality of ALD methods.

Dielectric formation on silicon wafers by the reaction of $O_3$ or $H_2O_2$ with a silicon source has also been described. Typical silicon sources are TEOS or $SiH_4$. The reaction on the wafer surface results in improved conformal fill properties through the formation of a liquid flowing material on the wafer surface, thus reducing the risk of seams or voids (see e.g., U.S. Pat. Nos. 5,314,724 and 6,133,160).

It is desirable to further improve the performance of dielectric deposition techniques, including CVD, ALD and RVD processes, leading to further improved gap fill capabilities, for example.

SUMMARY OF THE INVENTION

The present invention provides a method for depositing conformal dielectric films using alkoxy silanol or silanediol precursor starting materials and oxidizing and/or hydrolyzing agents. These precursor starting materials were previously believed to be unstable in the semiconductor processing context and only occurred as intermediates in dielectric film forming reactions. The precursor starting materials are oxidized or hydrolyzed in the method of the invention to produce an intermediate material with liquid-like flow properties. The high capillary forces exerted on these liquid dielectric precursor intermediates in high aspect ratio gaps results in more efficient gap fill than previous methods using silane (e.g., tetra-alkoxysilane) precursor starting materials since fewer oxidation reactions are required to achieve the liquid phase. Seams and voids are therefore avoided in gaps filled more efficiently with higher quality dielectric, and higher throughput is obtained. The films are dense as deposited, reducing or eliminating the need for post-deposition processing (e.g., annealing). In addition, the dielectric can be formed with or without a metal-containing catalyst/nucleation layer, so that metal content in the dielectric film can be avoided if desired.

The alkoxy-silanol/silanediol precursor is a silicon organic compound defined by formula I:

$$R_a R'_b R''_c Si(OH)_d \qquad (I)$$

wherein a+b+c+d=4; d=1 or 2; a+b+c=2 or 3; R, R' or R"=$OCH_3$, $OC_2H_5$, $OC_3H_7$, $OC_4H_9$, $OC_5H_{11}$, $OC_2H_3$, $OC_3H_5$, $OC_4H_7$, $OC_5H_9$, $CH_3$, $C_2H_5$, $C_2H_3$, $C_3H_7$, $C_3H_5$, $C_4H_{11}$, $C_4H_9$, $C_5H_{11}$, $C_5H_9$ or $OC_6H_5$ where at least one of R, R' or R" is an alkoxy functionality. For example, a tert-butoxy group, —$OC(CH_3)_3$ or (t-BuO), may be chosen for R and an iso-propoxy group, —$OCH(CH_3)_2$(i-PrO) may be chosen for R' and R" such that a+b+c=3 and d=1, resulting in the compound: (i-PrO)$_2$(t-BuO)SiOH. Many other precursor compounds defined by this formula can be used.

The oxidizing agent may be any suitable oxygen source including $O_2$, $O_3$, $H_2O_2$, $NO_2$, $N_2O_3$, $N_2O_5$ or $HNO_3$, or combinations thereof. The hydrolyzing agent may be any suitable compound containing hydrogen with some protic character (i.e., at least some dissociation in water to $H^+$ and the corresponding anion), such as $H_2O$ or $H_2O_2$, $HNO_3$, $H_2SO_4$, HF, $H_3PO_4$, $HOOCCF_3$, HCl, or combinations thereof.

The substrate may be a partially fabricated semiconductor wafer, in particular a wafer including shallow trench isolation (STI) or premetal dielectric (PMD) features, over which the dielectric film is to be deposited.

The films may be deposited with or without a metal-based catalyst or nucleation layer. Thus, in one embodiment, the substrate may simply be exposed to the alkoxy-silanol or alkoxy-silane-diol precursor and oxidizing and/or hydrolyzing agents under appropriate conditions for dielectric formation, generally a wafer temperature of about 200-300° C., which would be a typical (non-catalyzed) chemical vapor deposition approach. In another specific embodiment, an initial deposition could be a thin liner of RVD silicon oxide using, for example, exposure of the substrate to an aluminum-based precursor such as trimethyl aluminum prior to exposure of the substrate to an alkoxy-silanol/diol precursor such as $(tBuO)(iPrO)_2SiOH$ at a temperature of about 200-300° C. This results in the growth of a thin self-limiting layer (e.g., with a thickness of about 20 nm) which acts as a nucleation seed layer to ensure uniform subsequent $SiO_2$ film deposition. A second exposure of the substrate to the alkoxy-silanol/diol precursor with an oxidizing and/or hydrolyzing agent, such as $(tBuO)(iPrO)_2SiOH$ with ozone, follows, for example, to complete a gap fill.

These and other aspects and advantages of the present invention are described further below.

DETAILED DESCRIPTION OF SPECIFIC EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

Introduction

As indicated, the present invention provides a method for depositing conformal dielectric films using alkoxy silanol or silanediol precursor starting materials and oxidizing and/or hydrolyzing agents. These precursor starting materials were previously believed to be unstable in the semiconductor processing context and only occurred as intermediates in dielectric film forming reactions. The precursor starting materials are oxidized or hydrolyzed in the method of the invention to produce an intermediate material with liquid-like flow properties. The high capillary forces exerted on these liquid dielectric precursor intermediates in high aspect ratio gaps results in more efficient gap fill than previous methods using silane (e.g., tetra-alkoxysilane) precursor starting materials since fewer oxidation reactions are required to achieve the liquid phase. Seams and voids are therefore avoided in gaps filled more efficiently with higher quality dielectric, and higher throughput is obtained. The films are dense as deposited, reducing or eliminating the need for post-deposition processing (e.g., annealing). In addition, the dielectric can be formed with or without a metal-containing catalyst/nucleation layer, so that metal content in the dielectric film can be avoided if desired.

General Process Parameters

Figure 1:
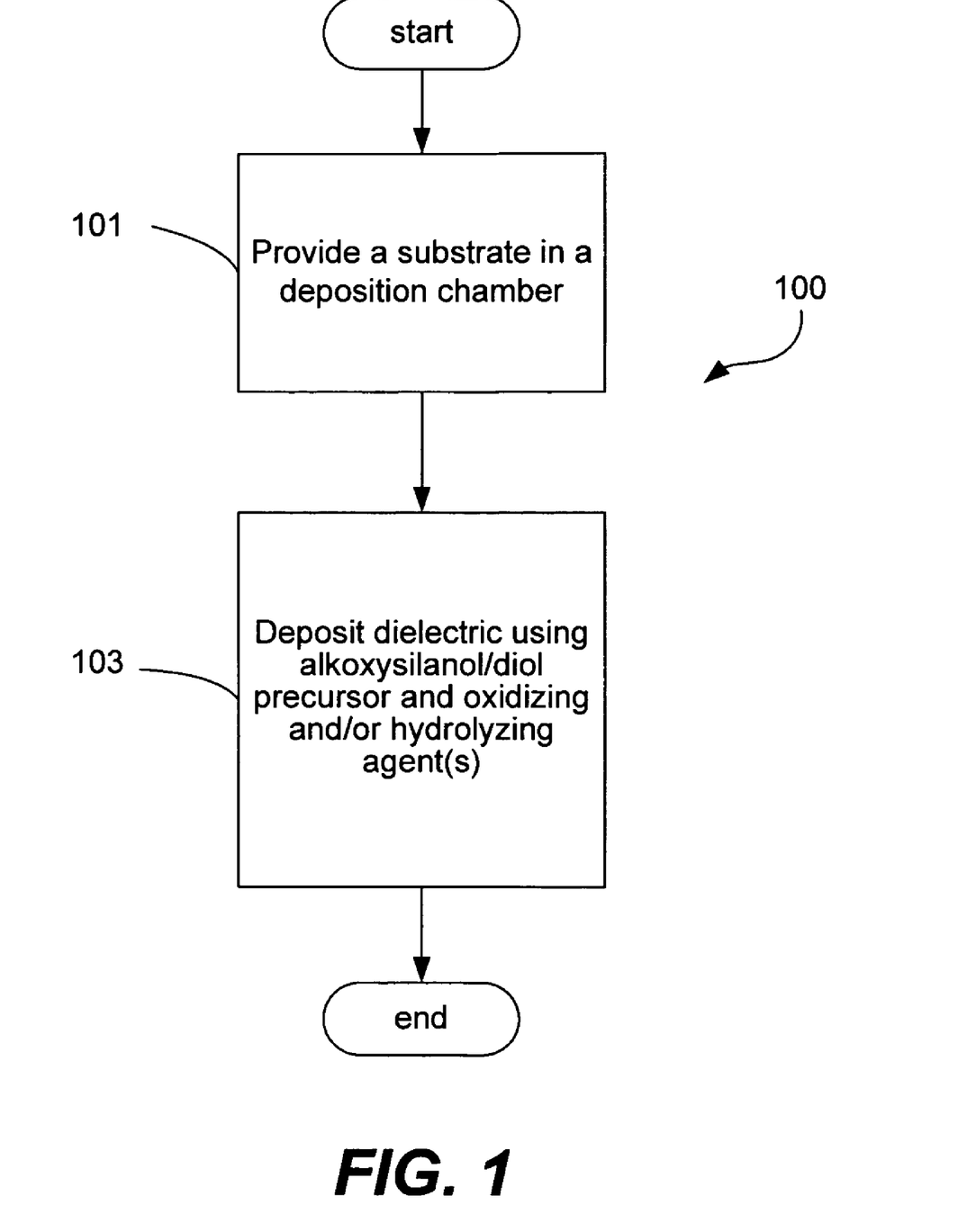
FIG. 1 is a process flow diagram illustrating relevant operations in a general process flow for a method of forming a dielectric in accordance with the present invention

FIG. 1 depicts a general process flow for a method of forming a dielectric in accordance with the present invention. Some general and preferred parameter ranges for the process are provided in Table 1, below:

TABLE 1

| Process parameters and range | Full Range | | Preferred range | |
|---|---|---|---|---|
| | minimum | maximum | minimum | maximum |
| Si precursor flow [sccm] | 1 | 10000 | 10 | 1000 |
| Oxidizer flow [sccm] | 1 | 10000 | 10 | 1000 |
| Hydrolyzing agent [sccm] | 1 | 10000 | 10 | 1000 |
| Dose time [seconds] | 0.1 | 1000 | 0.5 | 100 |
| Deposition pressure [Torr] | 0.001 | 760 | 10 | 200 |
| Substrate temperature [C.] | 0 | 600 | 100 | 400 |
| Showerhead temperature | 50 | 400 | 100 | 300 |
| chamber temperature | 50 | 400 | 100 | 300 |

The deposition process 100 begins with operation 101, wherein a substrate is placed into a deposition chamber. For many embodiments of the invention, the substrate is a semiconductor wafer. A "semiconductor wafer" as discussed in this document is a semiconductor substrate at any of the various states of manufacture/fabrication in the production of integrated circuits.

Next, in operation 103 a dielectric layer is deposited on the substrate. The substrate is exposed to the alkoxysilanol/diol precursor and oxidizing and/or hydrolyzing agent(s) under appropriate conditions for dielectric formation, generally a wafer temperature of about 200-300° C. This is a CVD approach and has the benefit of avoiding the need for any metal-based catalysts that will be incorporated into the resulting dielectric film.

A process of the present invention may also be combined in sequence with other deposition techniques to achieve a film having desired properties, such as stress, —OH content and conformality. Part of the film can be deposited using the CVD-based technique described above, and part with a different deposition technique. Examples of such different deposition techniques are conventional CVD, ALD, RVD, TEOS/$O_3$, HDP $SiO_2$ deposition, PECVD $SiO_2$ deposition or SOG each of which can be used in combination with a silanol/oxidizer/hydrolyzer deposition of the invention. In one example, a thin liner of a different deposition method (e.g., ALD or RVD) can be used to prevent effects of varying substrates and/or improve high aspect ratio gap fill capability. In another example the latter part of the film deposition can be performed using a different deposition technique (e.g., HDP or PECVD) because the trenches and gaps are less aggressive (have lower aspect ratios) than at the start of gap fill. In other embodiments, such a combined process can also include applying a capping layer to deposit a harder film or a film that forms better barrier for post deposition processing such as CMP or etch.

An embodiment of the present invention that incorporates an ALD or RVD-type step is found to be particularly beneficial for gap fill applications. In this embodiment, in operation (103) an initial deposition could be a thin liner of ALD/RVD silicon oxide using, for example, exposure of the substrate to an aluminum-based precursor such as trimethyl aluminum prior to exposure of the substrate to an alkoxysilanol/diol precursor, such as (tBuO)(iPrO)$_2$SiOH, at a temperature of about 200-300° C. This results in the growth of a thin self-limiting layer, for example with a thickness of about 20 nm, which acts as a nucleation seed layer to ensure uniform subsequent SiO$_2$ film deposition. A second exposure of the substrate to the alkoxy-silanol/diol precursor with an oxidizing and/or hydrolyzing agent, such as (tBuO)(iPrO)$_2$SiOH with ozone, follows. The ALD/RVD approach has the benefit of forming an even more conformal dielectric layer than CVD alone which may be advantageous in very narrow high aspect ratio gap fills.

For an example of a suitable RVD process, see U.S. patent application Ser. Nos. 10/672,309, titled "Properties Of A Silica Thin Film Produced By A Rapid Vapor Deposition [RVD] Process", filed on Sep. 26, 2003, which is incorporated by reference herein in its entirety for all purposes. In operation 103, illustrated in reaction stage (a) above, a metal catalyst-containing precursor gas is pumped into the deposition chamber so as to substantially saturate the surface with the metal-catalyst containing precursor. As noted above, the metal-based precursor on the substrate surface acts as an activation layer (or, in subsequent cycles, a re-activation layer) catalyzing a reaction with the subsequently deposited silicon precursor to form a dielectric more than one monolayer thick. These operations may be repeated as necessary to form a dielectric layer of the desired thickness.

Any suitable metal catalyst-containing precursor that can sufficiently adsorb onto the substrate surface and sufficiently react with the subsequently added silicon-containing precursor to form a dielectric layer that is more than a monolayer thick may be used. In addition, the metal-containing precursor should be capable of aiding the catalytic polymerization of the subsequently added silicon-containing precursor to produce a film thicker than a monolayer. The metal-containing precursor can be an aluminum, zirconium, hafnium, gallium, titanium, niobium, or tantalum compound or their halogenides, oxides or nitrides. To obtain monolayer coverage of the metal containing catalyst, exposure of the substrate to the metal precursor gas does not need to be very finely controlled. Flow rates of metal-containing precursor gas can range broadly, e.g., between about 1 and 10000 sccm. Alternatively flow rates are not controlled and the substrate is exposed to sufficient metal precursor that a monolayer coverage will form. Preferred flow rates of aluminum-containing precursor gas range between about 1 and 400 sccm. Alternately, the metal-containing precursor may be introduced into an isolated reaction chamber by opening a valve to a second chamber that contains a fixed amount of that precursor (i.e., 0.0001 to 1 g.)

In preferred embodiments, an aluminum-containing precursor, for example, hexakis(dimethylamino)di-aluminum (Al$_2$(N(CH$_3$)$_2$)$_6$) or trimethyl aluminum (Al(CH$_3$)$_3$) is used. Other suitable aluminum-containing precursors include, for example, triethyl aluminum (Al(CH$_2$CH$_3$)$_3$) or aluminum tri-chloride (AlCl$_3$).

In alternative embodiments of the invention in which a catalyst is used to prepare the substrate surface to enhance dielectric deposition characteristics, such as ALD/RVD-based processes, the catalyst can also be an acid or other chemical agent that makes the surface acidic. Examples of such chemicals are Brønsted acidic materials, such as HCl, acetic acid (HOOCCH$_3$), formic acid (HOOCH), nitric acid (HNO$_3$) phosphoric acid (H$_3$PO$_4$), triflic acid (HOOCCF3), HBr or HI, or Lewis acidic materials such as tricalkyl boride (BR$_3$) (R=CH$_3$, C$_2$H$_5$, C$_3$H$_7$, Cl, F or Br). It should be noted that upon reaction with water, Lewis acids become Brønsted Acids through the reaction: LA+H2O$\sqrt{}$H$^+$+ LAOH$^-$, where LA represents a the Lewis Acid.

The alkoxy-silanol/silanediol precursor is a silicon organic compound defined by formula I:

$$R_a R'_b R''_c Si(OH)_d \tag{I}$$

wherein a+b+c+d=4; d=1 or 2; a+b+c=2 or 3; R, R'or R''=OCH$_3$, OC$_2$H$_5$, OC$_3$H$_7$, OC$_4$H$_9$, OC$_5$H$_{11}$, OC$_2$H$_3$, OC$_3$H$_5$, OC$_4$H$_7$, OC$_5$H$_9$, CH$_3$, C$_2$H$_5$, C$_2$H$_3$, C$_3$H$_7$, C$_3$H$_5$, C$_4$H$_1$, C$_4$H$_9$, C$_5$H$_{11}$, C$_5$H$_9$ or OC$_6$H$_5$ where at least one of R, R'or R'' is an alkoxy functionality. For example, a tert-butoxy group, —OC(CH$_3$)$_3$ or (t-BuO), may be chosen for R and an iso-propoxy group, —OCH(CH$_3$)$_2$ (i-PrO) may be chosen for R' and R'' such that a+b+c=3 and d=1, resulting in the compound: (i-PrO)$_2$(t-BuO)SiOH. Many other precursor compounds defined by this formula can be used.

The oxidizing agent may be any suitable oxygen source including O$_2$, O$_3$, H$_2$O$_2$, NO$_2$, N$_2$O$_3$, N$_2$O$_5$ or HNO$_3$, or combinations thereof. Oxygen facilitates removal of residual organic content and higher temperature deposition resulting in improved film properties.

The hydrolyzing agent may be any suitable compound containing hydrogen with some protic character (i.e., at least some dissociation in water to H$^+$ and the corresponding anion), such as H$_2$O or H$_2$O$_2$, HNO$_3$, H$_2$SO$_4$, HF, H$_3$PO$_4$, HOOCCF$_3$, HCl, or combinations thereof.

Process conditions can be varied. Relevant process conditions can include precursor composition and flow rate, substrate temperature, pressure, exposure times and dose ranges, as are shown in table 1. In addition to the active reacts described above, inert gas such as N$_2$, Ar or He can also be added. Process parameters during exposure to the silanol/silanediol precursor will vary depending on the type of precursor(s) used, reaction chamber configuration and desired final film thickness, deposition rate and dielectric characteristics, among other variables. Substrate temperatures during deposition range broadly, from between about 0° C. and 600° C., preferably between about 100° C. and 500° C., and most more preferably between about 200° C. and 450° C. Pressures can range broadly, e.g., between about 1 mTorr and 760 Torr. Typical pressures range between about 1 Torr and 200 Torr. Flow rates of silicon-containing precursor gas can range broadly, e.g., between about 1 and 10,000 sccm. Preferred flow rates of silicon-containing precursor gas range between about 10 and 1000 sccm. The dose of silicon-containing precursor can range broadly, e.g., between about 0.001 milligrams and 100 grams. Typical silicon-containing precursor doses range between about 0.01 and 0.3 grams. Dose times can be chosen in the range between about 1 millisecond and 1000 seconds, where shorter doses are used when operating the process in a pulse mode. Preferred exposure times typically range between about 0.1 and 100 seconds. The number of separate exposures to silicon-containing precursor will primarily depend upon the desired final film thickness.

Post process cure of the as deposited film may be needed to obtain film properties that can be integrated for specific device applications. Such post cure process steps can be chosen from methods described in literature. Examples of cure methods available that can be applied are: thermal cure between 400° C. and 1100° C. at pressures of 0-1000 Torr above vacuum; RTP (rapid thermal processing methods); UV cure; plasma anneal with oxidizing or inert atmosphere plasma; steam anneal at temperatures between 400° C. and 900° C.; and combinations of above cure methods.

The process can also be operated in a "pulse mode," where alternating process steps are frequently repeated. One example for such pulse deposition is:

A: Exposure to silanol for 0.1 second
B: Exposure to oxidizing agent (e.g., 10% ozone) for 0.1 second
C: Repeat of A and B Al catalysts deposition using trimethyl-aluminum, for example, can be optional and if chosen, can precede the pulsing and be inserted after a number of cycles as needed and desired to obtain desired results.

Figure 2:
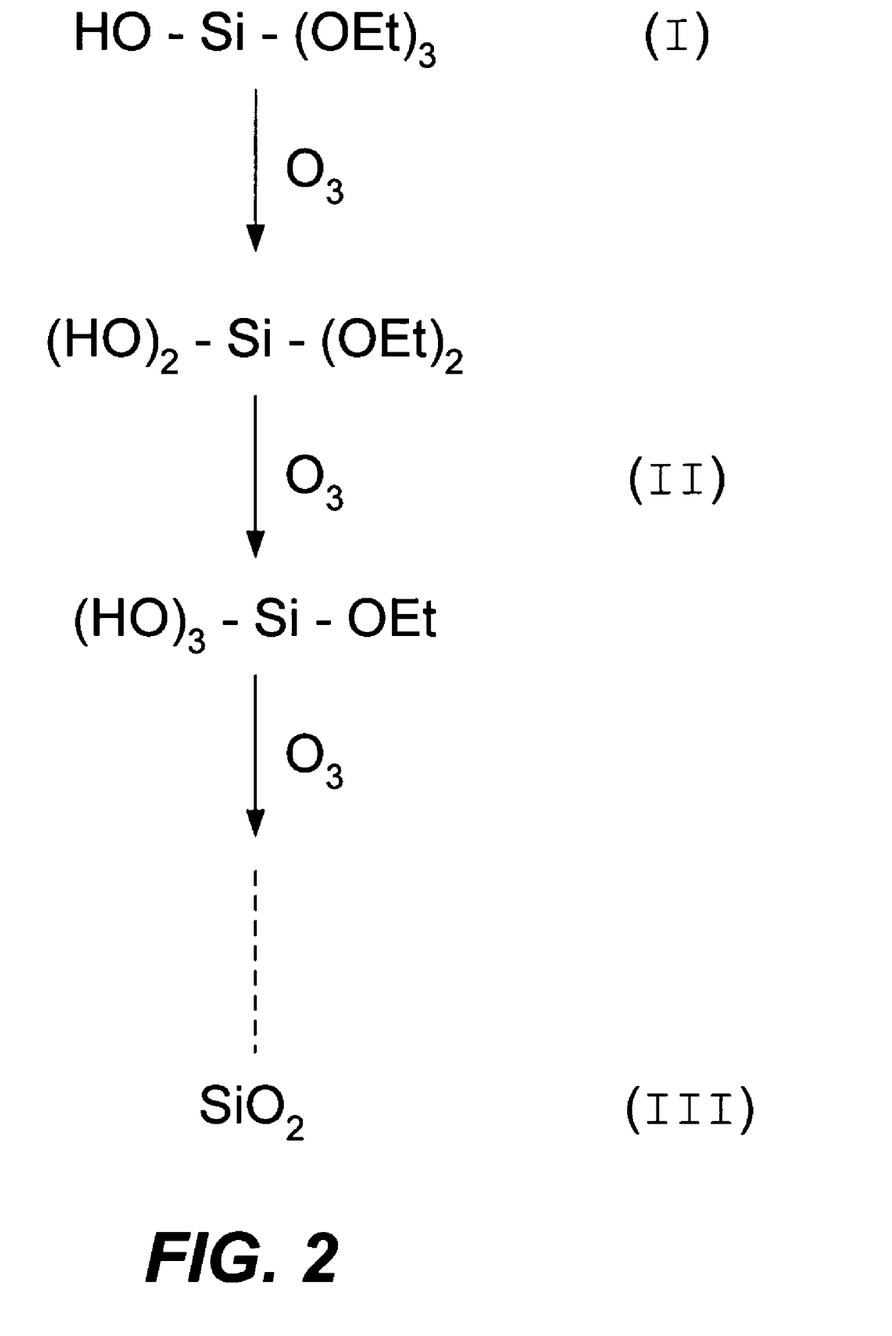
FIG. 2 is a drawing of a hypothesized reaction scheme for dielectric formation in accordance with one embodiment of the present invention.

Referring to FIG. 2, a reaction scheme for dielectric formation in accordance with one embodiment of the present invention is illustrated. In this embodiment, the precursor (I) is triethoxysilanol and the oxidizing or hydrolyzing agent is the oxidizing agent ozone ($O_3$). The reactants are in the gas phase. As the reaction proceeds, the alkoxy (ethoxy) substituents are first converted to hydroxyl (—OH) groups. Although the invention is not bound by any particular theory of operation, it is believed that the silane-polyol intermediates (II) formed condense from the gas phase into a silicone-like oil that more easily fills narrow high aspects ratio gaps due to capillary action. These polyols are then further oxidized to form the final solid silicon dioxide ($SiO_2$) film (III). As can be seen from this reaction scheme, the use of the silanol precursor, rather than a silane (e.g., tetra-alkoxysilane), reduces the number of required oxidation steps to obtain the silicon dioxide final product, rendering the process more efficient.

Figure 3A:
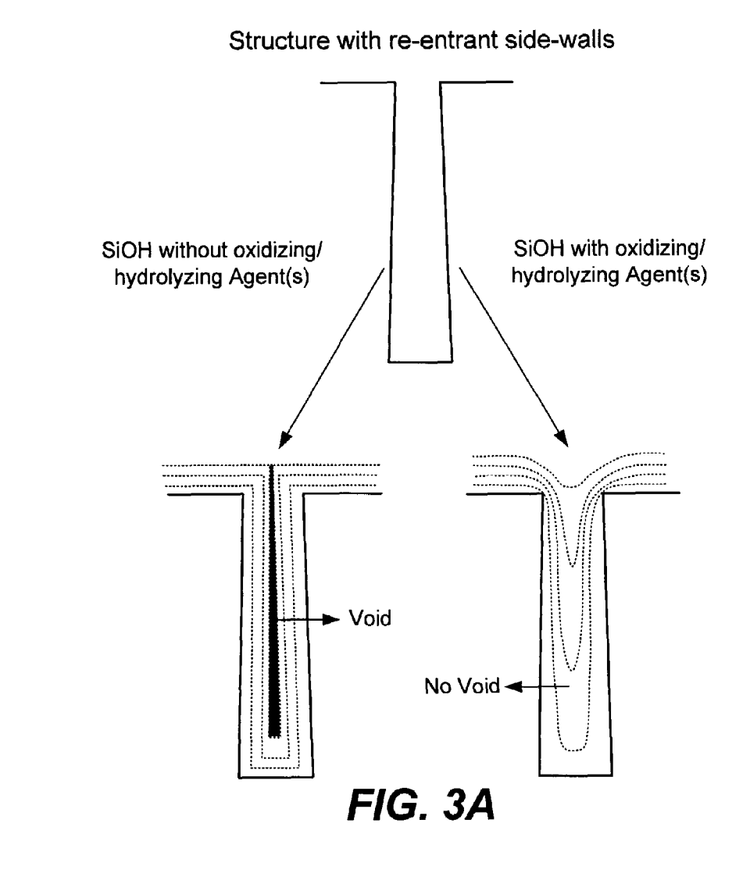
FIGS. 3A-B are illustrations comparing the conformality of films deposited over features (having re-entrant or vertical side-walls) on a substrate using silanols/silanediols and oxidizer/hydrolyzer in accordance with the present invention.
Figure 3B:
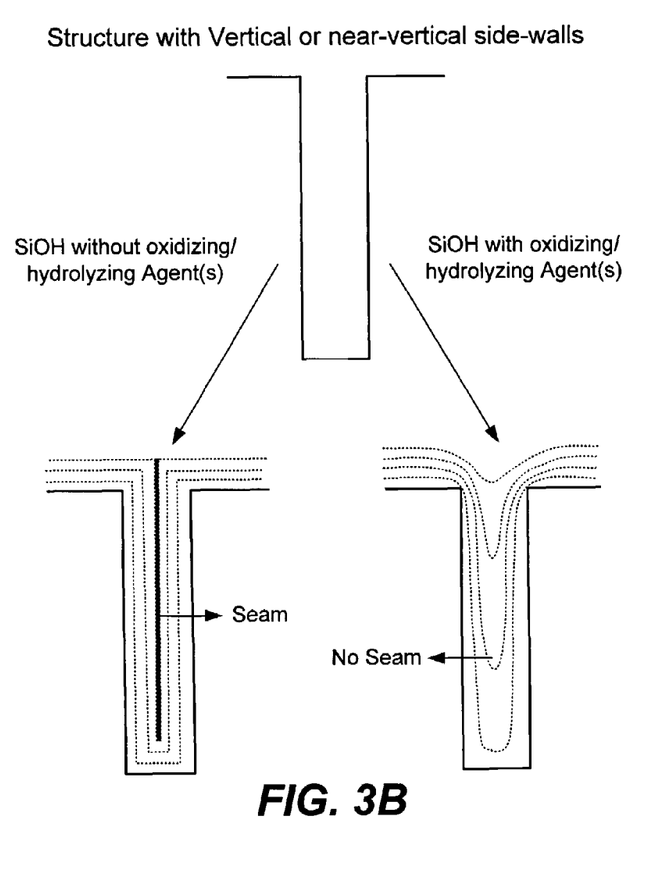

FIGS. 3A-B are illustrations comparing the conformality of films deposited over features (having re-entrant or vertical side-walls) on a substrate using silanols/silanediols and oxidizer/hydrolyzer in accordance with the present invention. A significant improvement (i.e., minimization or elimination of voids or seams) in gap fill performance is obtained when using the present invention relative to conventional gap fill techniques (i.e., without oxidizer/hydrolyzer). It is believed that the improvement is caused by the liquid-like flow characteristic of the condensed silane-polyols that more easily fills narrow high aspects ratio gaps due to capillary action.

In preferred embodiments of the invention, the substrate is a partially fabricated semiconductor wafer. Further, the wafer may include shallow trench isolation (STI) features, over which the dielectric film is to be deposited. Other potential substrates include, quartz, sapphire, glasses, ceramics, germanium or metals.

When a plurality of exposures of the substrate to different reacts is used, for example in a RVD approach, exposure to the catalytic metal (e.g., aluminum)-containing precursor and the silicon-containing precursor may occur in different chambers in preferred embodiments of the invention. Further, additional precursor gases may be used.

Deposition Apparatus

Figure 4:
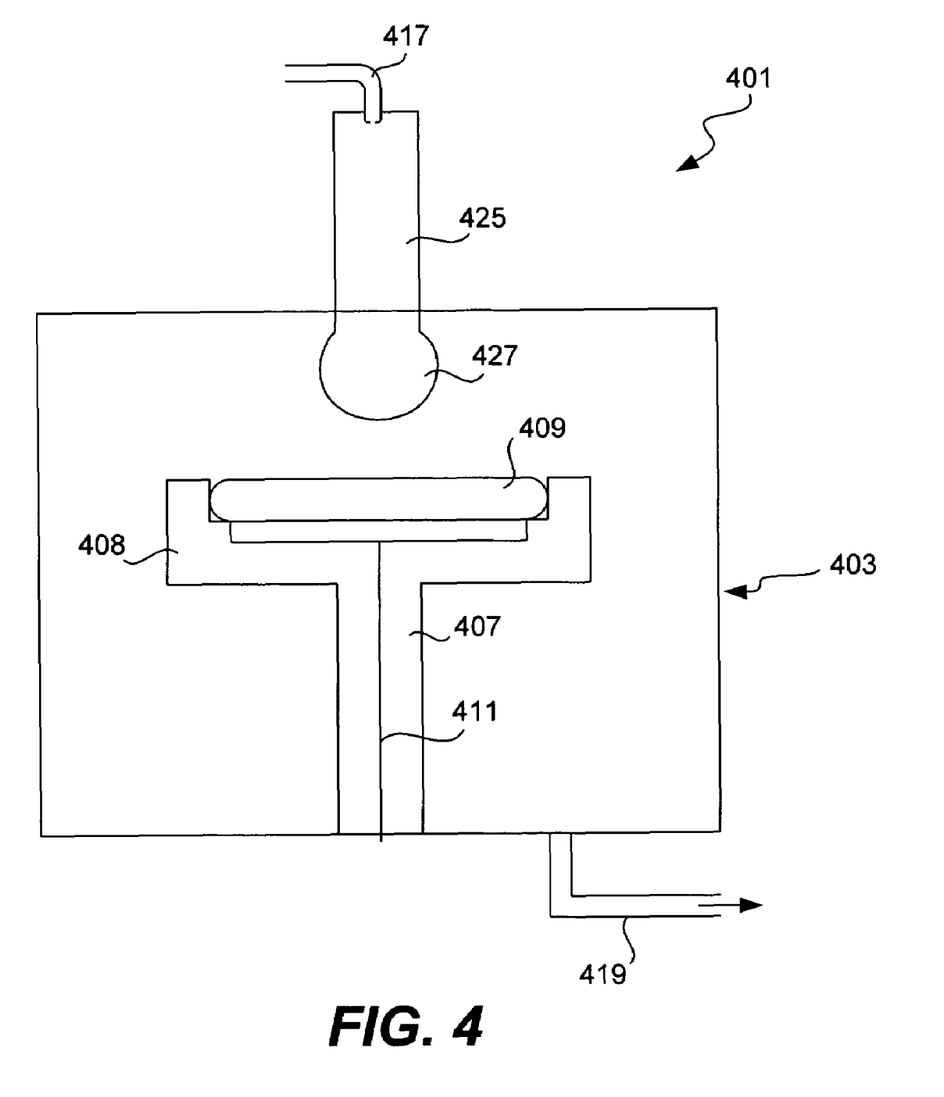
FIG. 4 is a schematic diagram showing the basic features of a deposition reactor module suitable for practicing the present invention.

FIG. 4 is a block diagram depicting some components of a suitable plasma reactor for performing a deposition process in accordance with this invention. Note that this apparatus may be used for CVD, ALD or RVD processes and is only an example of suitable apparatus in accordance with the present invention. Many other apparatuses and systems, including a multi-chambered apparatus, may be used.

As shown, a reactor 401 includes a process chamber 403, which encloses components of the reactor and serves to contain the reactant gases and provide and area to introduce the reactant gases to substrate 409. The chamber walls may be made of or plated with any suitable material, generally a metal that is compatible with the deposition and associated processes conducted therein. In one example, the process chamber walls are made from aluminum. Within the process chamber, a wafer pedestal 407 supports a substrate 409. The pedestal 407 typically includes a chuck 408 to hold the substrate in place during the deposition reaction. The chuck 408 may be an electrostatic chuck, a mechanical chuck or various other types of chuck as are available for use in the industry and/or research. A heat transfer subsystem including lines 411 for supplying a heat transfer fluid to the pedestal 407 controls the temperature of pedestal 407. In some embodiments, the heat transfer fluid comprises water or another liquid. The reactant gases, as well as inert gases during purge, are introduced individually into the reactor at tube 425 via inlet 417. A showerhead 427 may be used to distribute the gas flow uniformly in the process reactor. Reactant gases are introduced through a gas supply inlet mechanism including orifices. There may be multiple reactant gas tubes and inlets. A vacuum pump (e.g., a turbomolecular pump) connected to outlet 419 can draw out gases between RVD cycles.

Various details of the apparatus have been omitted for clarity's sake, and various design alternatives may be implemented. For example, in an alternate embodiment (not shown), there may be multiple deposition chambers, such that different depositions may occur in different chambers.

EXAMPLES

The following examples provide details concerning the implementation of embodiments of the present invention. It should be understood the following is representative only, and that the invention is not limited by the detail set forth in these examples.

Example 1

An ALD/RVD-based deposition in accordance with the present invention is conducted as follows:

A thin liner of silicon oxide is deposited by a 1 s pulse of trimethyl aluminum on a hot wafer (100-250° C.) followed by exposure to a combination of silanol precursor, (t-BuO)(i-PrO)$_2$SiOH, and 1-15% ozone at the same time at process pressure of between 1 and 200 Torr. Alternating deposition of Al catalyst and exposure to and combination of (t-BuO)(i-PrO)$_2$SiOH and 1-15% ozone is continued until desired film thickness has been achieved.

Example 2

A CVD-based deposition in accordance with the present invention is conducted as follows:

Vaporized (t-BuO)$_3$SiOH is injected into the reactor together with ozone (5-20%) at a process pressure of 1-760 Torr to complete the gap fill.

Example 3

A second ALD/RVD-based deposition in accordance with the present invention is conducted as follows:

A thin liner of aluminum catalyst is deposited by a 1 s pulse of trimethyl aluminum on a hot wafer (100-250° C.) followed by alternating pulses of a silanol precursor, (tBuO)$_3$ SiOH, and 5-20% ozone. Pulse length can vary between 1-1000 milliseconds. Deposition of the aluminum catalysts can be repeated every 2-100 pulse cycles and the sequence can be continued until desired film thickness is achieved.

Example 4

An ALD/RVD-based deposition in accordance with the present invention is conducted as follows:

A thin liner of Brønsted acid catalyst, $H_3PO_4$ is deposited by a 2 s pulse of phosphoric acid on a hot wafer (100-250° C.) followed by exposure to a combination of silanol precursor, $(t\text{-BuO})_3SiOH$, and $H_2O_2$ at the same time at process pressure of between 1 and 200 Torr. Repeat deposition cycles of the $H_3PO_4$ and $(t\text{-BuO})_3SiOH$ and $H_2O_2$ can be executed until desired film thickness has been achieved.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A method of forming a dielectric film, the method comprising:
   (a) providing a substrate in a deposition reactor chamber; and
   (b) in the absence of any halogen, providing an alkoxysilanol or alkoxysilanediol precursor with at least one from the group consisting of oxidizing and hydrolyzing agents to the chamber to react and form the dielectric film on the substrate surface.

2. The method of claim 1, wherein the temperature at which (b) is performed is between about 100° C. and 600° C.

3. The method of claim 1, wherein the alkoxysilanol or alkoxysilanediol precursor is a silicon organic compound defined by formula I:

(I)

wherein a+b+c+d=4; d=1 or 2; a+b+c=2 or 3; R, R' and R" are independently selected from the group consisting of $OCH_3$, $OC_2H_5$, $OC_3H_7$, $OC_4H_9$, $OC_5H_{11}$, $OC_2H_3$, $OC_3H_5$, $OC_4H_7$, $OC_5H_9$, $CH_3$, $C_2H_5$, $C_2H_3$, $C_3H_7$, $C_3H_5$, $C_4H_{11}$, $C_4H_9$, $C_5H_{11}$, $C_5H_9$ or $OC_6H_5$ wherein at least one of R, R' or R" is an alkoxy functionality.

4. The method of claim 3, wherein the oxidizing or hydrolyzing agent is a hydrolyzing agent containing hydrogen with some protic character.

5. The method of claim 4, wherein the hydrolyzing agent is selected from the group consisting of $H_2O$ or $H_2O_2$, $HNO_3$, $H_2SO_4$, $H_3PO_4$, $HOOCCF_3$, and combinations thereof.

6. The method of claim 3, wherein the oxidizing or hydrolyzing agent is an oxidizing agent is selected from the group consisting of $O_2$, $O_3$, $H_2O_2$, $NO_2$, $N_2O_3$, $N_2O_5$, $HNO_3$ and combinations thereof.

7. The method of claim 3, wherein the oxidizing agent is $O_3$.

8. The method of claim 7, wherein the alkoxysilanol or alkoxysilanediol precursor is $(tBuO)(iPrO)_2SiOH$.

9. The method of claim 7, wherein the alkoxysilanol or alkoxysilanediol precursor is $(i\text{-PrO})_2(t\text{-BuO})SiOH$.

10. The method of claim 1, further comprising, prior to (b):
    (c) treating the substrate surface with a catalyst or catalyst precursor to prepare the substrate surface to enhance dielectric deposition.

11. The method of claim 10, wherein the substrate surface is treated with a catalyst comprising a chemical agent that makes the substrate surface acidic.

12. The method of claim 11, wherein the catalyst is a Brønsted acid.

13. The method of claim 11, wherein the catalyst is a Lewis acid.

14. The method of claim 10, wherein (b) and (c) comprise:
    (i) exposing the substrate surface to a metal-containing precursor gas to form a substantially saturated layer of catalytic metal-containing precursor on the substrate surface; and
    (ii) exposing the substrate surface to a alkoxysilanol or alkoxysilanediol precursor gas with at least one from the group consisting of oxidizing and hydrolyzing agents to form a self-limiting dielectric film layer on the substrate surface.

15. The method of claim 14, wherein the alkoxysilanol or alkoxysilanediol precursor is a silicon organic compound defined by formula I:

(I)

wherein a+b+c+d=4; d=1 or 2; a+b+c=2 or 3; R, R' and R" are independently selected from the group consisting of $OCH_3$, $OC_2H_5$, $OC_3H_7$, $OC_4H_9$, $OC_5H_{11}$, $OC_2H_3$, $OC_3H_5$, $OC_4H_7$, $OC_5H_9$, $CH_3$, $C_2H_5$, $C_2H_3$, $C_3H_7$, $C_3H_5$, $C_4H_{11}$, $C_4H_9$, $C_5H_{11}$, $C_5H_9$ or $OC_6H_5$ wherein at least one of R, R' or R" is an alkoxy functionality.

16. The method of claim 15, wherein the metal containing precursor is selected from the list of metal-containing precursors comprising: aluminum, zirconium, hafnium, gallium, titanium, niobium and tantalum.

17. The method of claim 16, wherein the metal containing precursor comprises aluminum.

18. The method of claim 1, wherein the substrate is a partially fabricated semiconductor wafer and the dielectric film is deposited over a gap in the partially fabricated semiconductor wafer.

19. The method of claim 17, wherein the aluminum-containing precursor is at least one of hexakis(dimethylamino) di-aluminum and tri-methyl aluminum.

20. The method of claim 17, wherein the dielectric is deposited on the substrate as follows:
    a semiconductor wafer is heated to about 100-250° C.;
    the hot wafer is exposed a is pulse of trimethyl aluminum to form a substantially saturated aluminum-containing catalyst coating on the wafer surface;
    the hot wafer is exposed to $(tBuO)(iPrO)_2SiOH$ to form a nucleation layer;
    the hot wafer is exposed to $(tBuO)(iPrO)_2SiOH$ and $O_3$ to form the dielectric film on the nucleation layer.

21. The method of claim 20, wherein the wafer comprises a high aspect ratio gap to be filled, and deposition is stopped when the gap is filled.

22. The method of claim 17, wherein the dielectric is deposited on the substrate as follows:
 (a) a thin liner of aluminum catalyst is deposited by a 1 s pulse of trimethyl aluminum on a wafer heated to about 100-250° C.;
 (b) alternating pulses of $(tBuO)_3SiOH$ and 5-20% ozone are applied to the substrate; and
 (c) repeating (a) every 2-100 (b) pulse cycles until desired film thickness is achieved.

23. The method of claim 22, wherein the pulse length is between 1-1000 milliseconds.

* * * * *